United States Patent
Kojima et al.

(10) Patent No.: US 8,063,682 B2
(45) Date of Patent: Nov. 22, 2011

(54) SEMICONDUCTOR CIRCUIT FOR PERFORMING SIGNAL PROCESSING

(75) Inventors: Shoji Kojima, Tokyo (JP); Toshiyuki Okayasu, Tokyo (JP)

(73) Assignee: Advantest Corporation, Tokyo (JP)

( * ) Notice: Subject to any disclaimer, the term of this patent is extended or adjusted under 35 U.S.C. 154(b) by 73 days.

(21) Appl. No.: 12/403,312

(22) Filed: Mar. 12, 2009

(65) Prior Publication Data
US 2010/0060336 A1    Mar. 11, 2010

(30) Foreign Application Priority Data
Mar. 25, 2008    (JP) .................................. 2008-078013

(51) Int. Cl.
*H03L 7/00*     (2006.01)

(52) U.S. Cl. ........ 327/161; 327/147; 327/164; 327/237; 327/291; 327/292; 326/93; 326/94

(58) Field of Classification Search .................. 327/141, 327/147, 161, 164
See application file for complete search history.

(56) References Cited

U.S. PATENT DOCUMENTS

| | | | |
|---|---|---|---|
| 6,906,554 B1 * | 6/2005 | Chen | 326/93 |
| 2008/0056716 A1 * | 3/2008 | Fujikawa | 398/45 |

\* cited by examiner

*Primary Examiner* — Lincoln Donovan
*Assistant Examiner* — John Poos
(74) *Attorney, Agent, or Firm* — Martine Penilla Group, LLP

(57) ABSTRACT

A first signal processor performs predetermined signal processing on an input signal to provide a change to at least one of the characteristic values thereof. A second signal processor is provided in the subsequent stage of the first signal processor and performs predetermined signal processing on an output signal from the first signal processor to provide a change to a characteristic value thereof. An amount of change provided to the characteristic value of the signal by the second signal processor is dependent on a power supply voltage. An amount of change provided to the characteristic value of the signal by the first signal processor is configured to be adjustable. A control circuit monitors a power supply voltage supplied to the second signal processor and adjusts in accordance with the power supply voltage the amount of change provided to the characteristic value of the signal by the first signal processor.

8 Claims, 6 Drawing Sheets

SEMICONDUCTOR CIRCUIT FOR PERFORMING SIGNAL PROCESSING

CLAIM OF PRIORITY TO RELATED APPLICATION

The present application is claiming priority of Japanese Patent Application No. 2008-078013, filed on Mar. 25, 2008, the content of which is incorporated herein by reference.

BACKGROUND OF THE INVENTION

1. Field of the Invention

The present invention relates to a semiconductor circuit that performs certain signal processing on an input signal.

2. Description of the Related Art

Signal processing circuits, which perform certain signal processing on an input signal to provide a change to a characteristic value of the signal, for example, phase, amplitude and frequency characteristic, and output the signal thus changed, are widely used for various semiconductor circuits (hereinafter, referred to as ICs). Examples of such signal processing circuits include a delay circuit, amplifier, filter, and the like.

An amount of change provided to a characteristic value of a signal by the above signal processing circuit is sometimes dependent on a power supply voltage. For example, it is known that a delay amount of a delay circuit configured with multi-stage cascaded buffers (inverters) is affected by a power supply voltage. If a power supply voltage for such a signal processing circuit is generated by a switching power supply, an amount of change provided to a characteristic value of a signal varies due to the influence of a ripple of the power supply voltage. That is, there are problems that, in the case of a delay circuit, jitter is superimposed on a delay amount; and in the case of an amplifier, a ripple is superimposed on an amplitude of a signal.

SUMMARY OF THE INVENTION

The present invention has been made in view of these problems, and one of the purposes of the invention is to provide a semiconductor circuit in which the influence of a variation in a power supply voltage is suppressed.

A semiconductor circuit according to an embodiment of the present invention comprises a signal processing circuit and a control circuit. The signal processing circuit includes a first signal processor performing predetermined signal processing on an input signal to provide a change to at least one of the characteristic values thereof, and a second signal processor provided in the subsequent stage of the first signal processor and performing predetermined signal processing on an output signal from the first signal processor to provide a change to a characteristic value thereof. An amount of change provided to the characteristic value of the signal by one of the first and second signal processors is dependent on a power supply voltage. An amount of change provided to the characteristic value of the signal by the other of the first and second signal processors is configured to be adjustable. The control circuit monitors a power supply voltage supplied to one of the first and second signal processors and adjusts in accordance with the power supply voltage the amount of change provided to the characteristic value of the signal by the other of the first and second signal processors.

The "signal processing" means delay, amplification and filtering, etc., and the "characteristic value" refers to phase, amplitude and frequency, etc., of a signal. According to the embodiment, under the situation where a variation in a power supply voltage causes a variation in an amount of change provided to a characteristic value of an input signal by one of the signal processors, the variation in an amount of change in the characteristic value of the signal caused by the variation in a power supply voltage, which occurs in one of the signal processors, can be cancelled by the other of the signal processors. As a result, a variation in an amount of change provided to a characteristic value of an input signal by the whole semiconductor circuit, can be suppressed.

The control circuit may adjust an amount of change provided to a characteristic value of a signal by the other of the first and second signal processors such that an amount of change provided to the signal by the whole of the first and second signal processors is to be constant.

The control circuit may superimpose a variation having a polarity opposite to a variation in an amount of change provided to a characteristic value of a signal by one of the first and second signal processors, on an amount of change provided to the characteristic value of the signal by the other of the first and second signal processors. In this case, a variation in the amounts of changes provided to the characteristic values of signals by the two signal processors can be preferably cancelled.

The first and second signal processors may be delay circuits. In this case, a delay amount provided to an input signal by the whole semiconductor circuit can be stabilized, allowing a signal with less jitter to be generated.

The first and second signal processors may also be amplifier circuits, or filters.

The control circuit may comprises: a variable delay circuit that delays a reference clock to generate a delayed clock; and a phase detector that detects a phase difference between the reference clock and the delayed clock, generates a phase difference signal with a level corresponding to the phase difference, and performs feedback control of a delay amount of the variable delay circuit based on the phase difference signal. The control circuit may adjust a delay amount provided to a characteristic value of a signal by one of the first and second signal processors based on the phase difference signal. Because the phase difference signal follows a variation in a power supply voltage, the second signal processor can be preferably controlled by using the phase difference signal, allowing the whole delay amount to be stabilized.

Another embodiment of the present invention is a test apparatus. This test apparatus comprises the aforementioned semiconductor circuit to provide a delay to an inputted clock. By using the semiconductor circuit, jitter in a delay amount provided to the clock can be suppressed, allowing the test accuracy to be enhanced.

It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

Figure 1:
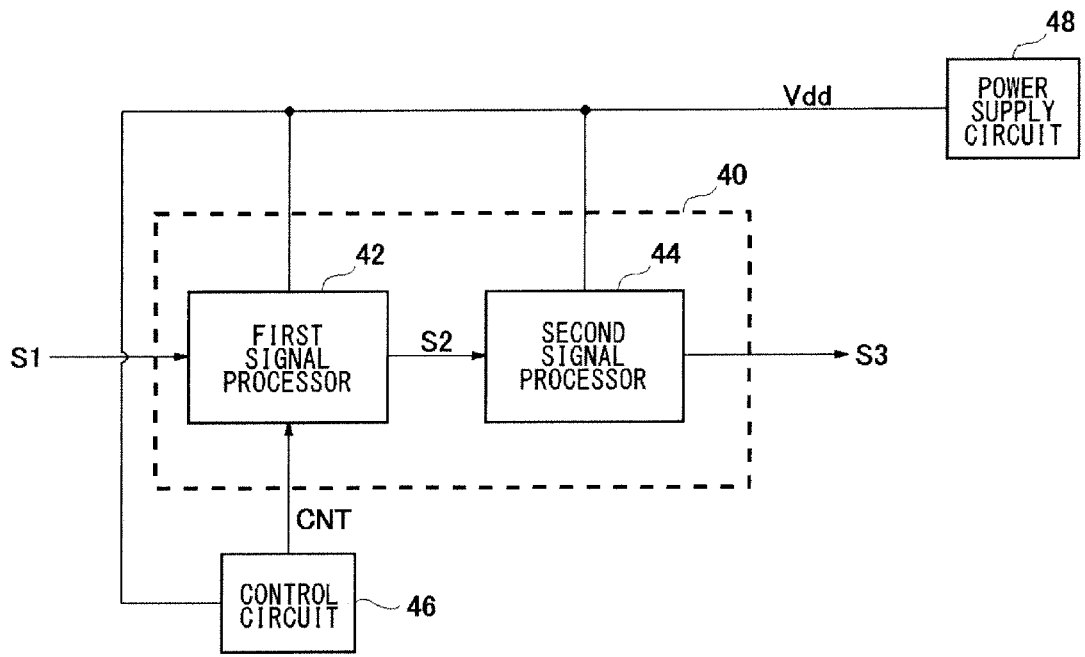
FIG. 1 is a block diagram illustrating the configuration of the semiconductor circuit according to an embodiment of the present invention.

FIG. 1 is a block diagram illustrating the configuration of the semiconductor circuit 6 according to the embodiment of the present invention. The semiconductor circuit 6 performs as a whole predetermined signal processing on an input signal S1 and generates an output signal S3. A content of the signal processing is not limited, but at least one of characteristic values of the input signal S1 is provided with a change. For example, if the signal processing is delay processing, the phase (timing at the edge) of the input signal S1, a characteristic value of the signal, is provided with a change. Besides, if the signal processing is amplification processing, the amplitude of the input signal S1, another characteristic value of the signal, is provided with a change. If the signal processing is filtering processing, the frequency characteristic of the input signal S1 is provided with a change. The present technique is also applicable to various signal processing, which are not exemplified.

The semiconductor circuit 6 comprises a signal processing circuit 40, a control circuit 46 and a power supply circuit 48.

The signal processing circuit 40 includes a first signal processor 42 and a second signal processor 44. The first signal processor 42 and the second signal processor 44 are connected with each other in series, and perform similar signal processing in two stages on the input signal S1, generating the output signal S3.

The first signal processor 42 in the preceding stage performs predetermined signal processing on a first signal S1, an input signal of the semiconductor circuit 6, to provide a change to the characteristic value of the signal S1, and then outputs the signal as a second signal S2. The second signal processor 44 in the subsequent stage performs predetermined signal processing on the second signal S2 outputted from the first signal processor 42 to provide a change to the characteristic value of the signal S2, and then generates a third signal S3.

The power supply circuit 48 generates a power supply voltage Vdd and supplies the voltage to the first and second signal processors 42 and 44.

For the purpose of facilitating understanding of the present invention, a specific description thereof will be made below, taking the case where the signal processing is "delay" processing as an example. The first signal S1 is, for example, a pulse signal, and the semiconductor circuit 6 provides as a whole a predetermined delay amount $\tau$ to the first signal S1.

It is assumed that an amount of change provided to the characteristic value of the first signal S1 (that is, phase) by the first signal processor 42 is $\tau1$, and an amount of change provided to that of the second signal S2 (that is, phase) by the second signal processor 44 is $\tau2$. That is, the semiconductor circuit 6 provides predetermined delay amount $\tau$ by dividing it into two stages, providing the delay amount $\tau1$ in the first stage by the first signal processor 42 and providing the delay amount $\tau2$ in the second stage by the second signal processor 44. Herein, $\tau=\tau1+\tau2$ holds.

The delay amount $\tau1$ or $\tau2$ to be provided to the first signal S1 or the second signal S2, which are respectively the input signals of the first signal processor 42 and the second signal processor 44, by one of the first signal processor 42 and the second signal processor 44, is dependent on the power supply voltage Vdd. A delay amount provided to the signal S1 or S2 by the other of the first signal processor 42 and the second signal processor 44, is configured to be adjustable. In other words, the other of the first signal processor 42 and the second signal processor 44 is a variable delay circuits.

The embodiment will be described assuming that the delay amount $\tau2$ of the second signal processor 44 is dependent on the power supply voltage, and the delay amount $\tau1$ of the first signal processor 42 is adjustable. However, the relationship between the two signal processors 42 and 44 may be opposite thereto.

Figure 2:
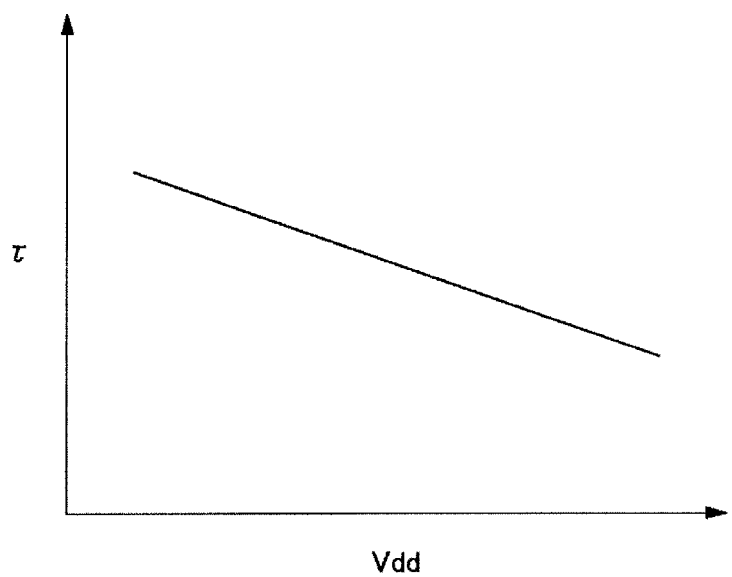
FIG. 2 is a graph illustrating dependency of a delay amount provided by a second signal processor, a delay circuit, on a power supply voltage.

FIG. 2 is a graph illustrating the dependency of the delay amount $\tau2$ provided by the second signal processor 44, a delay circuit, on the power supply voltage. For example, if the second signal processor 44 is configured with multi-stage cascaded inverters, the delay amount $\tau2$ varies dependently on the power supply voltage Vdd. Specifically, as the power supply voltage Vdd is higher, the delay amount $\tau2$ is smaller. If the second signal processor 44 is an amplifier circuit, a gain thereof is to be dependent on the power supply voltage.

The control circuit 46 monitors the power supply voltage Vdd supplied to the second signal processor 44, which is one side of the two signal processors, and adjusts the delay amount $\tau1$ of the first signal processor 42, which is the other side thereof, in accordance with the power supply voltage Vdd. A signal that the control circuit 46 generates for controlling the delay amount $\tau1$ is termed a control signal CNT.

The control circuit 46 adaptively adjusts the delay amount $\tau1$ provided to a signal by the first signal processor 42 such that an amount of change (a delay amount) provided to the signal by the whole of the first and second signal processors 42 and 44 is to be constant.

In the stage of designing the semiconductor circuit 6, the dependency of the delay amount $\tau2$ of the second signal processor 44 on the power supply voltage can be obtained through a simulation or an experiment. That is, an error $\Delta\tau2$ between the delay amount $\tau2$ and the target value thereof. $\tau d2$ becomes known as a function of the power supply voltage Vdd. The second signal processor 44 adjusts the delay amount $\tau1$ of the first signal processor 42 so as to cancel the error $\Delta\tau2$.

Figure 3:
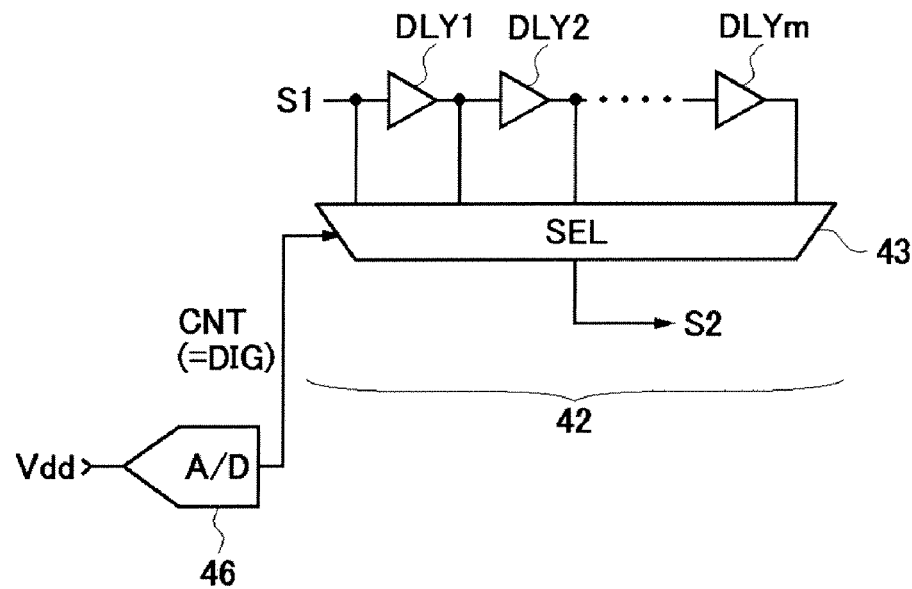
FIG. 3 is circuit diagram illustrating a first configuration example of a first signal processor and a control circuit.

FIG. 3 is circuit diagram illustrating a first configuration example of the first signal processor 42 and the control circuit 46. The first signal processor 42, a variable delay circuit, comprises a plurality of delay elements DLY1 to DLYm, which are connected to each other in series. A tap is provided in the output of each delay element and a signal appearing in the tap is inputted to a selector 43. The selector 43 is configured to be capable of selecting any one of the signals.

The control circuit 46 is a digital/analog conversion circuit to convert the power supply voltage Vdd to a digital value DIG. The selector 43 decodes the digital value DIG outputted from the control circuit 46 and selects the tap corresponding to the value. The digital value DIG corresponds to the control signal CNT in FIG. 1.

By designing the decoder of the selector 43 in accordance with the dependency of the delay amount $\tau 2$ of the second signal processor 44 on the power supply voltage, an delay amount $\tau$ of the whole semiconductor circuit 6 can be maintained at a constant value irrespective of a variation in the power supply voltage.

Figure 4:
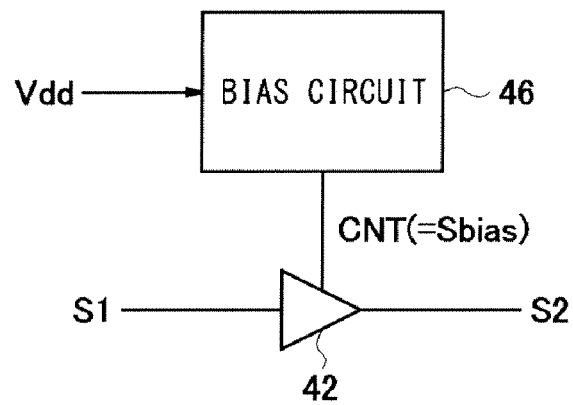
FIG. 4 is a circuit diagram illustrating a second configuration example of the first signal processor and the control circuit.

FIG. 4 is a circuit diagram illustrating a second configuration example of the first signal processor 42 and the control circuit 46. The first signal processor 42 is a variable delay circuit, the delay amount $\tau 1$ of which is adjustable by a bias signal Sbias of a current or a voltage. The control circuit 46 adjusts the bias signal Sbias in accordance with the power supply voltage Vdd and then supplies the signal to the first signal processor 42. The bias signal Sbias corresponds to the control signal CNT in FIG. 1.

Also in the circuit in FIG. 4, by designing the relationship between the bias signal Sbias generated by the control circuit 46 and the power supply voltage Vdd in accordance with the dependency of the delay amount $\tau 2$ of the second signal processor 44 on the power supply voltage, the delay amount $\tau$ of the whole semiconductor circuit 6 can be maintained at a constant value irrespective of a variation in the power supply voltage. A person skilled in the art can configure the control circuit 46 by appropriately combining an adder, subtractor and amplifier, etc., in accordance with the relationship between the bias signal Sbias and the power supply voltage Vdd.

Figure 5:
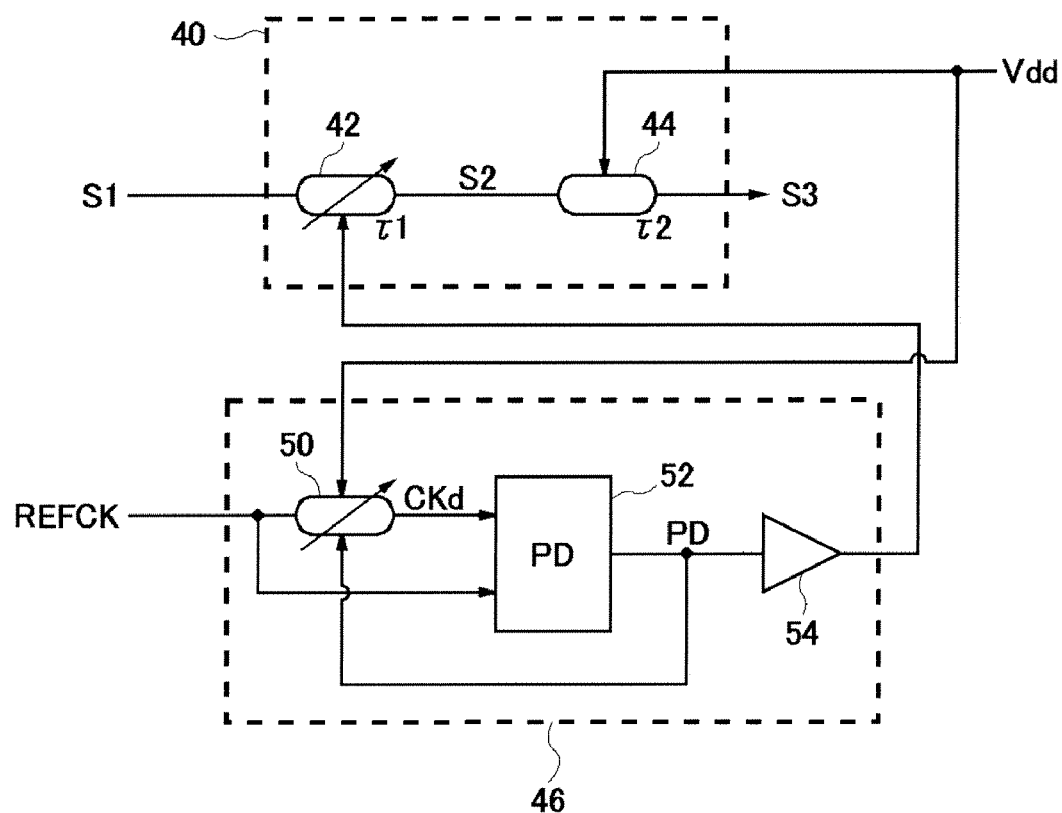
FIG. 5 is circuit diagram illustrating a specific configuration example of the semiconductor circuit in FIG. 1.

FIG. 5 is circuit diagram illustrating a specific configuration example of the semiconductor circuit 6 in FIG. 1. The control circuit 46 in FIG. 5 includes a variable delay circuit 50, a phase detector 52, and a coefficient setting unit 54, and is configured by using a so-called DLL (delay Locked Loop).

The variable delay circuit 50 delays the reference clock REFCLK to generate the delayed clock CKd. The phase detector 52 detects a phase difference between the reference clock REFCLK and the delayed clock CKd to generate a phase difference signal PD with a level corresponding to the phase difference. The phase detector 52 performs feedback control of a delay amount of the variable delay circuit 50 based on the phase difference signal PD thus generated. The variable delay circuit 50 is activated upon receiving the same power supply voltage Vdd as that of the second signal processor 44, a delay circuit of the signal processing circuit 40.

Even when the power supply voltage Vdd varies, a delay amount of the variable delay circuit 50 is adjusted by the variable delay circuit 50 so as to cancel the variation, and the phase of the delayed clock CKd is locked. Accordingly, the phase difference signal PD generated by the phase detector 52 varies following the power supply voltage Vdd.

The control circuit 46 adjusts the delay amount $\tau 1$ of the first signal processor 42 based on the phase difference signal PD that varies following the power supply voltage Vdd. The coefficient setting unit 54 receives the phase difference signal PD and performs a predetermined operation on the signal to output it to the first signal processor 42, a variable delay circuit. A content of the operation processing performed by the coefficient setting unit 54 is designed in accordance with values of the phase difference signal PD and the delay amount $\tau 1$ of the first signal processor 42.

The control circuit 46 configured as the DLL may have a form of either digital control or analog control.

In the case of the digital control, the variable delay circuit 50 may adopt a circuit having the form in FIG. 3, in which the number of stages of the delay elements can be switched. In this case, the coefficient setting unit 54 serves as a so-to-speak decoder described in FIG. 3. In the case of the analog control, the variable delay circuit 50 may be configured with the form illustrated in FIG. 4, in which a delay of the circuit is adjusted in accordance with the analogue bias signal Sbias. In this case, the coefficient setting unit 54 may multiply the phase difference signal PD, an analog signal, by, for example, a predetermined coefficient to supply the result to the first signal processor 42. The coefficient is preferably subjected to calibration in the stage of designing the semiconductor circuit 6.

The first signal processor 42, a variable delay circuit, and the variable delay circuit 50 may or may not be configured in the same way as each other. When configured in the same way, there is an advantage that correction processing in the coefficient setting unit 54 can be simplified. However, even when configured in a different way, the delay amount $\tau 1$ can be properly controlled if the operation processing performed by the coefficient setting unit 54 is optimized.

Figure 6:
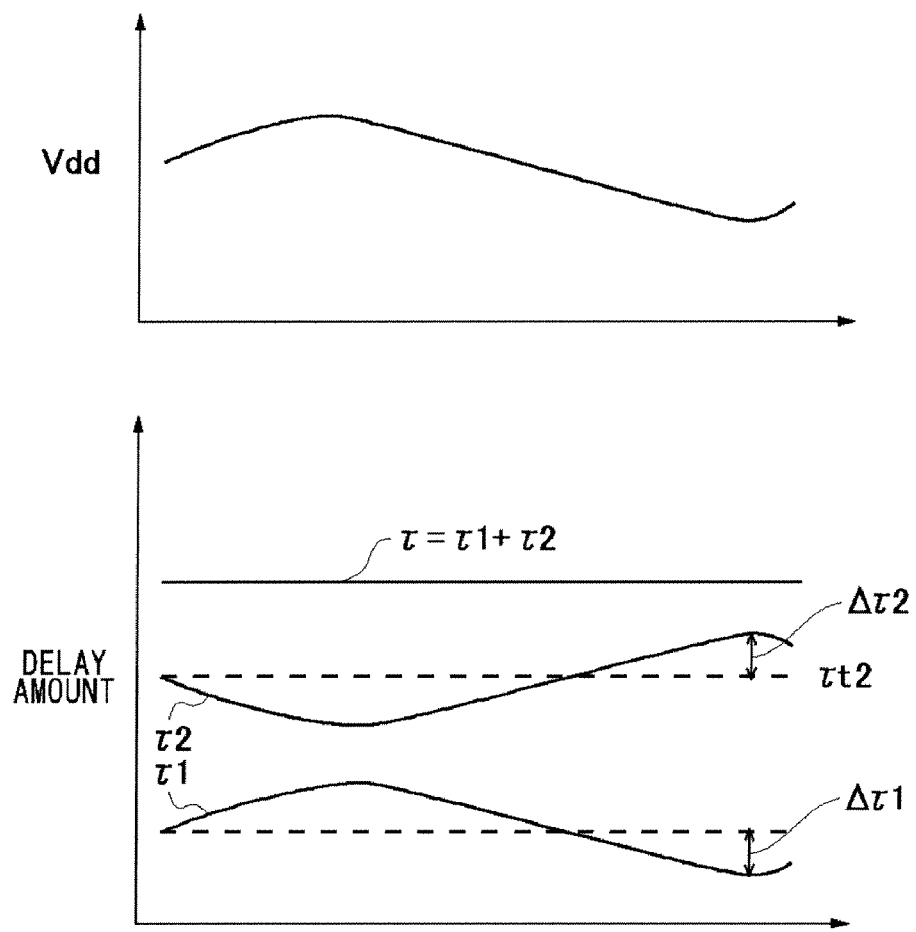
FIG. 6 is time charts illustrating performance of the semiconductor circuit in FIG. 1.

The description with respect to the configuration of the semiconductor circuit 6 according to the embodiment has been made above. Subsequently, the performance of the semiconductor circuit 6 will be described. FIG. 6 is time charts illustrating the performance of the semiconductor circuit 6 in FIG. 1. The upper chart in the drawing illustrates the power supply voltage Vdd, and the lower one illustrates the delay amount $\tau 1$ provided by the first signal processor 42, the delay amount $\tau 2$ by the second signal processor 44, and the total delay amount $\tau$ by the whole semiconductor circuit 6.

The power supply voltage Vdd is ideally stabilized at the target voltage, but really varies as illustrated in FIG. 6 by affected by a load variation or an input voltage variation. Due to the variation of the power supply voltage Vdd, the delay amount $\tau 2$ of the second signal processor 44 varies. The control circuit 46 adjusts the delay amount $\tau 1$ of the first signal processor 42 so as to cancel the error $\Delta\tau 2$ between the delay amount $\tau 2$ and the target value of the second signal processor 44. As a result, the total delay amount $\tau=\tau 1+\tau 2$ can be maintained at a constant value without the influence of the variation in the power supply voltage Vdd.

From a different viewpoint, it can be understood that the control circuit 46 superimposes the variation $\Delta\tau 1$ having a polarity opposite to the variation $\Delta\tau 2$ in the delay amount of the second signal processor 44, on the delay amount $\tau 1$ of the first signal processor 42.

The semiconductor circuit 6 according to the embodiment has been described above. Subsequently, applications suitable for the semiconductor circuit 6 will be described. The semiconductor circuit 6 can be used in a semiconductor test apparatus (hereinafter, simply referred to as a test apparatus) 100.

Delay circuits are used in various portions within the test apparatus 100, and the semiconductor circuit 6 in FIG. 1 can be preferably adopted in such delay circuits.

Figure 7:
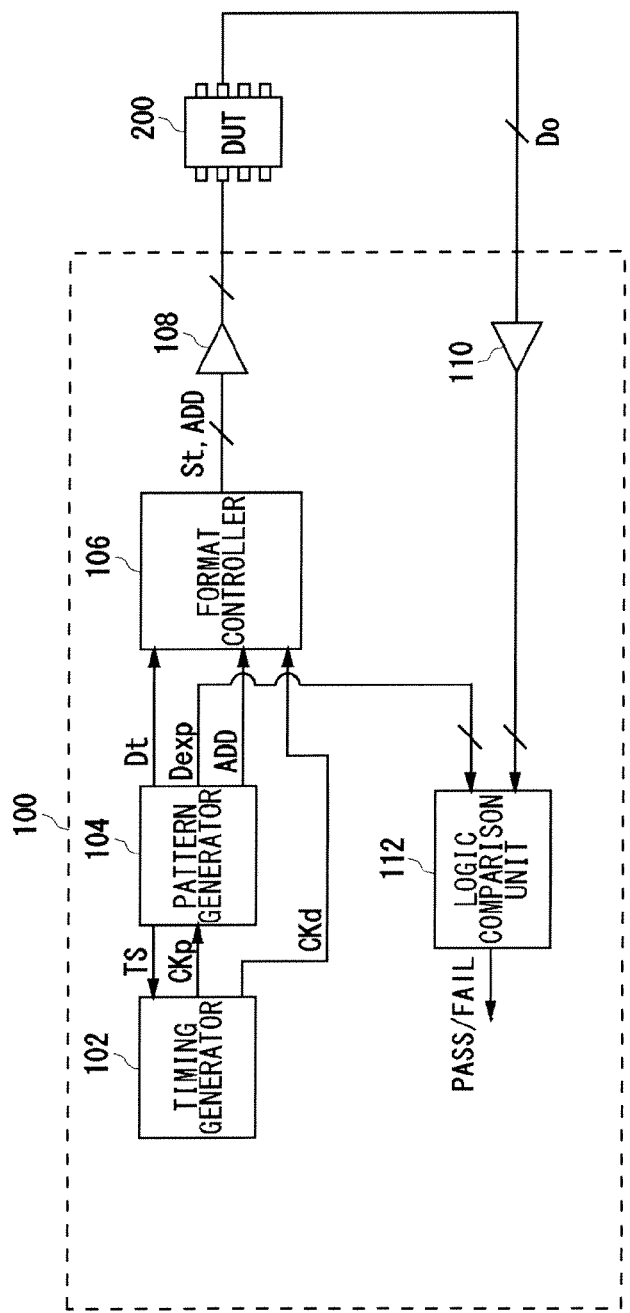
FIG. 7 is a block diagram illustrating a configuration example of a test apparatus according to the embodiment.

FIG. 7 is a block diagram illustrating a configuration example of the test apparatus 100 according to the embodiment. The test apparatus 100 determines whether the data to be tested outputted from the DUT 200 is consistent with the expected value. The DUT is, for example, a memory.

The test apparatus 100 comprises a timing generator 102, a pattern generator 104, a format controller 106, a write driver 108, a comparator 110, and a logic comparison unit 112.

The pattern generator 104 generates a timing set signal (hereinafter, referred to as a "TS signal") and supplies it to the timing generator 102. The timing generator 102 generates a periodic clock CKp and a delayed clock CKd based on the timing data specified by the TS signal, and supplies the periodic clock CKp to the pattern generator 104 and the delayed clock CKd to the format controller 106, respectively. The pattern generator 104 generates an address ADD indicating each of the blocks, which are a plurality of memory areas the DUT 200 has, and a plurality of test pattern data items Dt, which are to be written in each of the plurality of blocks, and supplies them to the format controller 106.

The format controller 106 generates a test pattern signal St corresponding to the test pattern data Dt generated by the pattern generator 104, based on the delayed clock CKd supplied by the timing generator 102. The format controller 106 supplies the address ADD, which is supplied by the pattern generator 104, and the test pattern signal St thus generated, to the DUT 200 via the write driver 108.

The pattern generator 104 generates in advance the expectation data Dexp, data to be outputted by the DUT 200 in accordance with the address ADD and the test pattern signal St, and supplies the data to the logic comparison unit 112.

The comparator 110 reads the data Do corresponding to the address ADD from the DUT 200 and outputs it to the logic comparison unit 112. The logic comparison unit 112 compares the data Do read from the DUT 200 with the expected value data Dexp supplied by the pattern generator 104 to determine whether the DUT 200 is good.

Figure 8A:
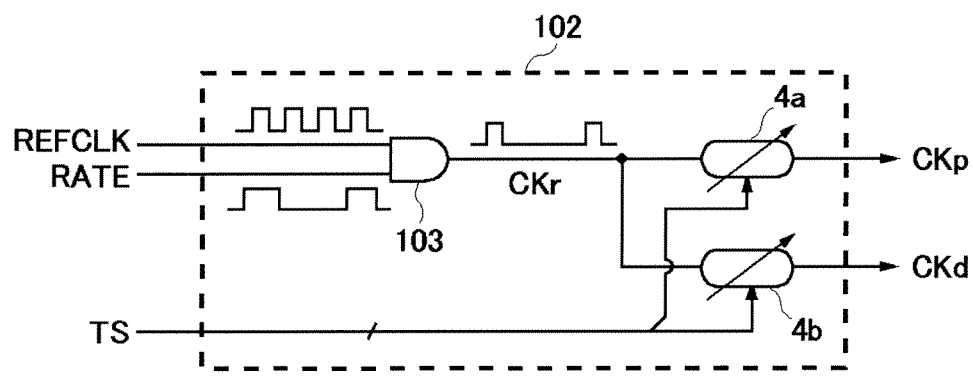
FIGS. 8A and 8B are block diagrams illustrating a configuration of a timing generator.
Figure 8B:
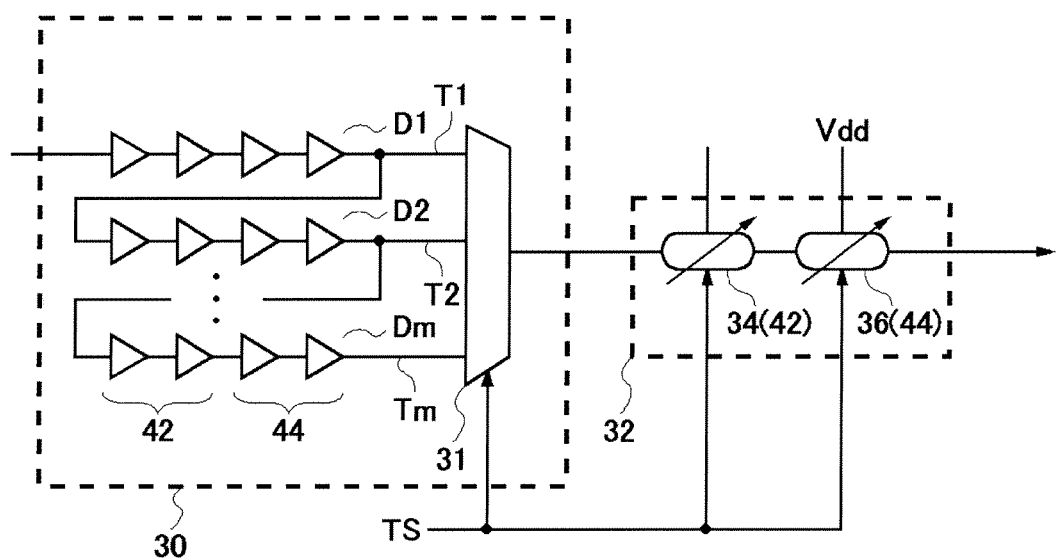

FIGS. 8A and 8B are block diagrams illustrating a configuration of the timing generator 102. FIG. 8A illustrates the configuration of the timing generator 102, and FIG. 8B illustrates a configuration example of the delay circuit used in the timing generator. As illustrated in FIG. 8A, the timing generator 102 comprises: a pulse selection unit 103 that takes out a pulse corresponding to a test rate from the reference clock REFCLK with a frequency of several hundred MHz; and delay circuits 4a and 4b that delay the selected pulse.

The reference clock REFCLK and a pulse signal (hereinafter, refereed to as a rate signal RATE) with a lower frequency than the reference clock REFCLK, are inputted to the pulse selection unit 103. The functions of the pulse selection unit 103 can be simply represented by an AND gate, and takes out the edge of the reference clock REFCLK with a window set by the rate signal RATE. A pulse CKr with a frequency corresponding to the test rate is outputted from the pulse selection unit 103.

The delay circuits 4a and 4b provide a delay corresponding to the TS signal to the output CKr outputted from the pulse selection unit 103, and generate the periodic clock CKp and the delayed clock CKd. The technique for stabilizing a delay of the semiconductor circuit 6 according to the embodiment is applied to at least one of the delay circuits 4a and 4b, preferably to both of them.

As illustrated in FIG. 8B, the delay circuits 4a and 4b comprise a prepositive delay circuit 30 provided in the preceding stage and a postpositive delay circuit 32 provided in the subsequent stage. The delay circuits 4a and 4b provide the whole variable delay of 0 to 2 ns to the pulse CKr, respectively. The prepositive delay circuit 30 provides a course delay at several-ns order intervals; and the postpositive delay circuit 32 provides a fine delay at several tens-ps order intervals.

The technique of the semiconductor circuit 6 described with reference to FIG. 1 is applicable to either the prepositive delay circuit 30 or the postpositive delay circuit 32.

The prepositive delay circuit 30 comprises multiple m pieces (m is an integer) of sub-delay circuits D1 to Dm and a selector 31. The sub-delay circuits D1 to Dm are connected in cascade, each of which provides a predetermined delay amount $\tau d1$ to $\tau dm$, respectively. Taps T1 to Tm are provided in connection nodes of the sub-delay circuits D1 to Dm. From the ith tap, a pulse receiving a synthesized delay $\Sigma \tau di$ in which delay amounts $\tau 1$ to $\tau i$ of the 1st stage to the ith stage are summed up, is outputted. The selector 31 selects any one of pulses generated in the plurality of taps in accordance with the TS signal.

Each of the sub-delay circuits D1 to Dm corresponds to the semiconductor circuit 6 in FIG. 1; hence, the sub-delay circuits D1 to Dm are divided into the first signal processors 42 and the second signal processors 44, respectively. In FIG. 8B, the sub-delay circuits D1 to Dm are respectively configured to include multi-stage cascaded delay elements. The first signal processor 42 includes delay elements in the preceding stage, and the second signal processor 44 includes delay elements in the subsequent stage. A delay amount of the delay elements in the preceding stage, which are included in the first signal processor 42, is configured to be variable by the control signal CNT (not illustrated); and a delay amount of the delay elements in the subsequent stage, which are included in the second signal processor 44, varies in accordance with the power supply voltage Vdd.

According to the prepositive delay circuit 30, the influence provided to the respective delay amounts $\tau d1$ to $\tau dm$ of the sub-delay circuits D1 to Dm by a ripple of the power supply voltage, can be suppressed.

The postpositive delay circuit 32 in the subsequent stage has also the configuration corresponding to the semiconductor circuit 6 in FIG. 1. That is, the postpositive delay circuit 32 is configured to be divided into a first sub-delay circuit 34 and a second sub-delay circuit 36. The first sub-delay circuit 34 corresponds to the first signal processor 42 in FIG. 1, and the second sub-delay circuit 36 corresponds to the second signal processor 44 in FIG. 1. Also, the configurations of the first sub-delay circuit 34 and the second sub-delay circuit 36 are not particularly limited, but may be configured to include a plurality of multi-stage cascaded delay elements and to be capable of switching the number of the stages of the delay elements in accordance with the TS signal. Alternatively, the first and second sub-delay circuits 34 and 36 may be configured to be capable of adjusting biases of the delay elements.

Also, by configuring the postpositive delay circuit 32 in the same way as the semiconductor circuit 6 in FIG. 1, jitter in delay amounts in the first sub-delay circuit 34 and the second sub-delay circuit 36, which occur due to a ripple of the power supply voltage, can be canceled out.

The test apparatus 100 is required to have higher timing accuracy than a general electronic device and a semiconductor circuit. In particular, the jitter in the timing generator 102 has a great impact on the test accuracy, and hence it should be suppressed as much as possible. In a conventional test apparatus, a linear regulator capable of generating a ripple-free power supply voltage is generally used in order to suppress jitter in the timing generator 102. However, even when the linear regulator is used, it cannot be avoided that a power supply voltage varies due to a load variation of the regulator or an input voltage variation, the variation in the power supply voltage causing jitter.

By using the semiconductor circuit 6 according to the embodiment, jitter in a timing signal caused by a variation in the power supply voltage can be reduced.

In addition, because the efficiency of the linear regulator is significantly deteriorated as compared with that of a switching regulator, a conventional test apparatus consumes a large amount of power. In the conventional test apparatus, however, when intending to use the switching power supply instead of the linear regulator, a delay amount of a delay circuit varies due to a ripple of a power supply voltage; resulting in the difficulty of replacing the linear regulator with the switching power supply. A variation in a delay amount caused by a ripple of a switching power supply can be suppressed by using the semiconductor circuit 6 according to the embodiment; hence a switching power supply can be adopted in a test apparatus, allowing energy consumption to be reduced.

While the preferred embodiments of the present invention have been described using specific terms, such description is for illustrative purposes only, and it is to be understood that changes and variations may be made without departing from the spirit or scope of the appended claims.

What is claimed is:

1. A semiconductor circuit comprising:
   a signal processing circuit that includes a first signal processor configured to receive a signal on its input terminal, to perform predetermined signal processing on the signal to provide a change to at least one of the characteristic values thereof, and to output the signal thus processed from its output terminal being different from its input terminal, and
   a second signal processor provided in the subsequent stage of the first signal processor and configured to receive the signal from the output terminal of the first signal processor on its input terminal, to perform predetermined signal processing on the signal on its input terminal, to provide a change to a characteristic value thereof, and to output the signal thus processed from its output terminal being different and separate from its input terminal,
   wherein an amount of change provided to the characteristic value of the signal by one of the first and second signal processors is dependent on a voltage level of a power supply voltage, and an amount of change provided to the characteristic value of the signal by the other of the first and second signal processors is configured to be adjustable; and
   a control circuit that monitors a power supply voltage supplied to said one of the first and second signal processors and adjusts in accordance with the voltage level of the power supply voltage the amount of change provided to the characteristic value of the signal by the said other of the first and second signal processors.

2. The semiconductor circuit according to claim 1, wherein the control circuit adjusts an amount of change provided to a characteristic value of a signal by the said other of the first and second signal processors such that an amount of change provided to a signal by the whole of the first and second signal processors is to be constant.

3. The semiconductor circuit according to claim 1, wherein the control circuit superimposes a variation having a polarity opposite to a variation in an amount of change provided to a characteristic value of a signal by said one of the first and second signal processors, on an amount of change provided to the characteristic value of the signal by the said other of the first and second signal processors.

4. The semiconductor circuit according to claim 1, wherein the first and second signal processors are delay circuits.

5. The semiconductor circuit according to claim 4, wherein the control circuit comprises:
   a variable delay circuit that delays a reference clock to generate a delayed clock; and
   a phase detector that detects a phase difference between the reference clock and the delayed clock, generates a phase difference signal with a level corresponding to the phase difference, and performs feedback control of a delay amount of the variable delay circuit based on the phase difference signal, wherein the control circuit adjusts a delay amount provided to a characteristic value of a signal by the said other of the first and second signal processors based on the phase difference signal.

6. A test apparatus comprising the semiconductor circuit according to claim 4 to provide a delay to an inputted clock.

7. A semiconductor circuit comprising:
   a signal processing circuit that includes a first signal processor performing predetermined signal processing on an input signal to provide a change to at least one of the characteristic values thereof, and a second signal processor provided in the subsequent stage of the first signal processor and performing predetermined signal processing on an output signal from the first signal processor to provide a change to a characteristic value thereof, wherein an amount of change provided to the characteristic value of the signal by one of the first and second signal processors is dependent on a voltage level of a power supply voltage, and an amount of change provided to the characteristic value of the signal by the other of the first and second signal processors is configured to be adjustable; and
   a control circuit that monitors a power supply voltage supplied to said one of the first and second signal processors and adjusts in accordance with the voltage level of the power supply voltage the amount of change provided to the characteristic value of the signal by the said other of the first and second signal processors;
   wherein the control circuit superimposes a variation having a polarity opposite to a variation in an amount of change provided to a characteristic value of a signal by said one of the first and second signal processors, on an amount of change provided to the characteristic value of the signal by the said other of the first and second signal processors.

8. A semiconductor circuit comprising:
   a signal processing circuit that includes a first signal processor performing predetermined signal processing on an input signal to provide a change to at least one of the characteristic values thereof, and a second signal processor provided in the subsequent stage of the first signal processor and performing predetermined signal processing on an output signal from the first signal processor to provide a change to a characteristic value thereof, wherein an amount of change provided to the characteristic value of the signal by one of the first and second signal processors is dependent on a voltage level of a power supply voltage, and an amount of change provided to the characteristic value of the signal by the other of the first and second signal processors is configured to be adjustable; and
   a control circuit that monitors a power supply voltage supplied to said one of the first and second signal processors and adjusts in accordance with the voltage level of the power supply voltage the amount of change provided to the characteristic value of the signal by the said other of the first and second signal processors;
   wherein the first and second signal processors are delay circuits;
   wherein the control circuit includes a variable delay circuit that delays a reference clock to generate a delayed clock, and a phase detector that detects a phase difference between the reference clock and the delayed clock, generates a phase difference signal with a level corresponding to the phase difference, and performs feedback control of a delay amount of the variable delay circuit based on the phase difference signal, wherein the control circuit adjusts a delay amount provided to a characteristic value of a signal by the said other of the first and second signal processors based on the phase difference signal.

* * * * *